United States Patent
Lechner et al.

(10) Patent No.: US 10,495,684 B2
(45) Date of Patent: Dec. 3, 2019

(54) METHOD AND CIRCUIT FOR DETECTING AN OPEN RESOLVER EXCITER LINE

(71) Applicant: Robert Bosch GmbH, Stuttgart (DE)

(72) Inventors: Benjamin Lechner, Neuhausen (DE); Daniel Raichle, Vaihingen (DE); Daniel Zirkel, Wiernsheim-Serres (DE); Michael Ungermann, Darmstadt (DE)

(73) Assignee: Robert Bosch GmbH, Stuttgart (DE)

( * ) Notice: Subject to any disclaimer, the term of this patent is extended or adjusted under 35 U.S.C. 154(b) by 188 days.

(21) Appl. No.: 15/737,533

(22) PCT Filed: Jun. 7, 2016

(86) PCT No.: PCT/EP2016/062852
§ 371 (c)(1),
(2) Date: Dec. 18, 2017

(87) PCT Pub. No.: WO2016/202631
PCT Pub. Date: Dec. 22, 2016

(65) Prior Publication Data
US 2018/0172757 A1    Jun. 21, 2018

(30) Foreign Application Priority Data
Jun. 18, 2015 (DE) ........................ 10 2015 211 224

(51) Int. Cl.
*G01R 31/28* (2006.01)
*G01R 31/02* (2006.01)
(Continued)

(52) U.S. Cl.
CPC ........... *G01R 31/2829* (2013.01); *G01D 5/20* (2013.01); *G01D 18/00* (2013.01); *G01R 31/026* (2013.01)

(58) Field of Classification Search
None
See application file for complete search history.

(56) References Cited

U.S. PATENT DOCUMENTS 5,861,768 A * 1/1999 Fujita ................ H02M 3/33507
                                                      318/661
9,315,106 B2 * 4/2016 Fu .......................... B60L 3/0038
                    (Continued)

FOREIGN PATENT DOCUMENTS

DE    102009020431    11/2009
DE    102011078583    1/2013
(Continued)

OTHER PUBLICATIONS

International Search Report for Application No. PCT/EP2016/062852 dated Sep. 29, 2016 (English Translation, 3 pages).

*Primary Examiner* — Jermele M Hollington
(74) *Attorney, Agent, or Firm* — Michael Best & Friedrich LLP

(57) ABSTRACT

A method for detecting an open resolver exciter line (10) comprises the following steps: —measuring the signal voltages $U_s$ and $U_c$ of the sine coil (17) and the cosine coil (18) of the resolver (15); —comparing the amplitude $U_s^2+U_c^2$ of the resolver signal to a first threshold value $C_{S1}$; —starting a diagnostic mode having the following steps if the amplitude $U_s^2+U_c^2$ does not reach the first threshold value $C_{S1}$; —applying a constant voltage to the exciter line (11, 12) via a series resistance (25) $R_{LE}$ that is large compared to the ohmic resistance of the exciter coil (16) $R_E$; —measuring the voltage difference $U_E(t_1)$ at the terminals (5, 6) of the exciter line at a number of points in time $t_i$ during at least one excitation period; and —determining the DC voltage component $U_{E,Offs}$ of the voltage difference $U_E$; —determining that there is an open exciter line (10) if, during the excitation period, the DC voltage component $U_{E,Offs}$ is larger than a second threshold value $C_{S2}$.

9 Claims, 2 Drawing Sheets

(51) Int. Cl.
 *G01D 5/20* (2006.01)
 *G01D 18/00* (2006.01)

(56) References Cited

U.S. PATENT DOCUMENTS

| | | | |
|---|---|---|---|
| 10,359,467 B2* | 7/2019 | Lechner | G01R 31/2829 |
| 2003/0006761 A1* | 1/2003 | Hiramatsu | G01D 5/2291 |
| | | | 324/207.16 |
| 2004/0090227 A1* | 5/2004 | Hiramatsu | G01D 5/2291 |
| | | | 324/207.18 |
| 2009/0179605 A1* | 7/2009 | Kanekawa | G01D 5/20 |
| | | | 318/490 |
| 2014/0142782 A1 | 5/2014 | Fu et al. | |
| 2015/0276373 A1* | 10/2015 | Ide | G01B 7/30 |
| | | | 324/207.16 |
| 2018/0111485 A1* | 4/2018 | Lechner | G01D 5/2291 |
| 2018/0172756 A1* | 6/2018 | Lechner | G01D 5/2291 |

FOREIGN PATENT DOCUMENTS

| | | |
|---|---|---|
| EP | 2610601 | 7/2013 |
| EP | 2657667 | 10/2013 |
| JP | 2012098188 | 5/2012 |
| JP | 2012098195 | 5/2012 |

\* cited by examiner

METHOD AND CIRCUIT FOR DETECTING AN OPEN RESOLVER EXCITER LINE

BACKGROUND OF THE INVENTION

The invention relates to a method for identifying an open resolver exciter line, and to a circuit for realizing this method.

Resolvers are used for ascertaining the angular position of a rotating object, for example the drive shaft of an engine. In the prior art, there are various types of resolver. In principle, a varying magnetic field is generated in this case by means of at least one coil and this field is detected by means of at least one further coil, wherein the strength of the coupling between the coils varies depending on the position or angular position to be measured. In the case of the "variable reluctance resolver" (VR resolver), for example, only one exciter coil is used and there are two measuring coils which generate position-dependent signals. German patent application DE 10 2011 078 583 A1 discloses, for example, an evaluation of resolver sensor signals in a vehicle. For this purpose, a resolver picks up a rotating movement of a rotor, and a processor element processes the sinusoidal and cosinusoidal output signals of the resolver.

SUMMARY OF THE INVENTION

The invention is based on a resolver of this kind, wherein the exciter signal is sinusoidal and typically has a frequency of 10 kHz. The two measuring coils are generally positioned orthogonally in relation to one another and are called the sinusoidal coil and the cosinusoidal coil. The angle of the object being measured can be unambiguously determined using the two measurement signals.

The exciter signal for the exciter coil can be provided, for example, by two push-pull output stages, one each for the two connections of the exciter coil. The output signals of the two output stages are then phase-shifted by 180° in relation to one another and the exciter signal which is effective for the exciter coil is the differential voltage between the outputs of the two output stages.

However, it is also possible to operate the exciter coil using only one output stage. The second connection of the exciter coil is then applied either directly or via a capacitor to a fixed potential, for example ground potential.

An AC voltage signal with the same frequency as the exciter signal is produced at the receiver coils, the amplitude of said AC voltage signal, however, being modulated in accordance with the position of the rotor, wherein the signal at the cosinusoidal coil is phase-shifted by 90° with respect to the signal at the sinusoidal coil.

Resolvers are frequently used for controlling permanent-magnet synchronous machines (PSM) and electrically excited synchronous machines (ESM) which are used, for example, as a drive for hybrid and electric vehicles. Control of this kind requires knowledge of the current angle position of the rotor. Control of asynchronous machines (ASM) requires knowledge of the current frequency of the drive.

Owing to their robustness, resolvers are preferably used for these purposes in motor vehicles even if there are alternative sensors, for example digital angle transducers or sensors based on the eddy current effect.

Possible ways of diagnosing possible faults are desirable for sensors in the automotive sector. For resolvers as are the subject matter of the present application, a possible fault to be diagnosed is an open line in the exciter path of the resolver, that is to say at least one connection of the exciter coil no longer has an electrical connection for driving or there is a cable fracture within the exciter coil.

One possible way of diagnosing a fault of this kind is that neither receiver signal (sinusoidal and cosinusoidal) is present any longer. However, a diagnosis of this kind is inadequate because the absence of a sinusoidal signal and a cosinusoidal signal can also have other causes, for example a short circuit in the exciter line or a simultaneous interruption in both receiver signals.

The method for identifying an open resolver exciter line comprises, initially, permanently monitoring the functioning of the resolver by tapping off the signal voltages from the sinusoidal coil and the cosinusoidal coil and comparing the vectorial amplitude, calculated therefrom, of the sum of the signal voltages with a first threshold value. If this signal does not reach the threshold value, a diagnosis mode is started, in which a DC voltage is applied to the exciter line via a series resistor for the duration of at least one exciter period, and the voltage difference at the connections of the exciter line is measured during this time. The exciter line is identified as being open if the DC voltage component of this voltage difference is greater than a second threshold value. An exciter period is understood to mean, in particular, a period of the exciter signal which is usually sinusoidal.

Another aspect of the invention involves a circuit which realizes this method. The circuit proceeds from the circuit to be examined, which circuit comprises a control apparatus with a processor and a power stage for providing the signal for the exciter line, furthermore the exciter line, which is to be diagnosed, to the exciter coil of the resolver, and the signal lines for the sinusoidal signal and cosinusoidal signal which run back to the control apparatus. The circuit further comprises two A/D converters which are connected to the connections for the signal lines and the outputs of which can be read and processed by the processor.

The circuit further comprises electronic switches, which are controlled by the processor, for connecting a constant voltage to the two outputs for the exciter signal via a series resistor, and it comprises a third A/D converter which is connected to the output for the exciter signal and is connected to the processor. Finally, the circuit comprises a display and/or storage device for displaying and/or storing the information which is identified by the processor and includes the positive identification of an open exciter line of the resolver and indication of the open line.

The advantage of the invention is that the fault to be diagnosed can be precisely distinguished from other faults (pinpointing diagnosis). Diagnosis is also very rapid since reliable fault diagnosis takes place as early as after a few periods of the exciter signal with a typical duration of 0.1 ms, and suitable measures can be taken if necessary. Therefore, in particular, requirements for sensors in the automotive sector in respect of functional reliability and in respect of OBD (on-board diagnosis) functionality can be met.

It is also advantageous that the method according to the invention can be implemented with minimum addition to the usual hardware of a resolver drive.

DETAILED DESCRIPTION

Figure 1:
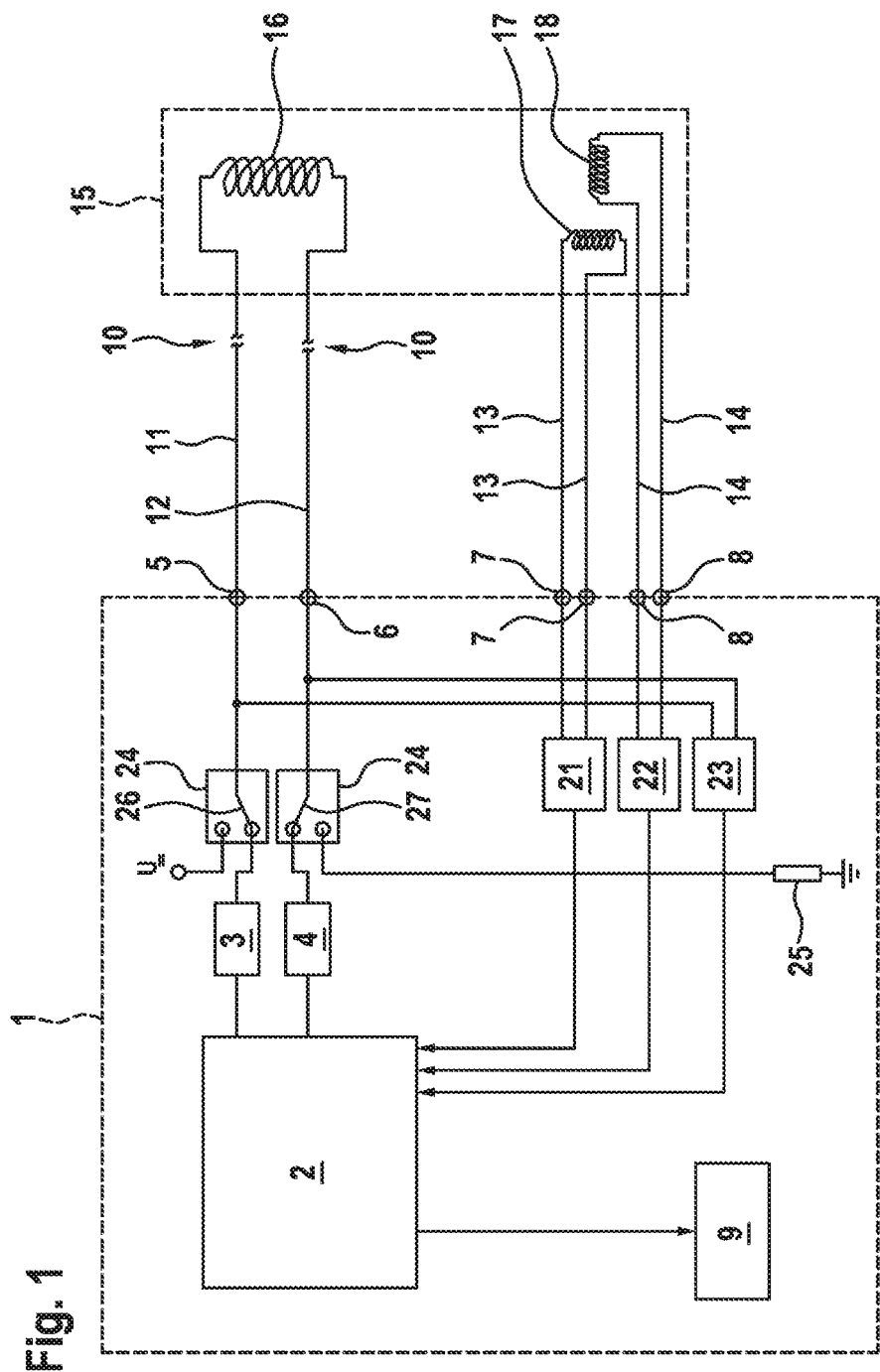
FIG. 1 shows a circuit according to an exemplary embodiment of the invention.

In FIG. 1, the control apparatus 1 for the resolver is in the center and can be integrated in the control device for a vehicle (not illustrated here). It has a processor 2 (or also uses one) which monitors the correct sequence of all of the resolver functions to be controlled and also indicates malfunctions, if necessary.

The control apparatus 1 controls, in particular, the power stages 3 and 4 for providing the sinusoidal exciter signal for the exciter coil 16 of the resolver 15 at the first connections 5 and 6. At the second connections 7 and 8, the signals of the sinusoidal coil 17 and of the cosinusoidal coil 18, which signals represent the instantaneous angular position of the object being measured (for example the shaft of the engine), pass to the control device 1 and, after conversion in the A/D converters 21 and 22, can be processed further as a digital signal using software.

The resolver exciter lines 11 and 12 represent the connection from the first connections of the control apparatus 1 to the resolver 15, specifically to its exciter coil 16. These lines must be monitored in respect of an interruption, this being indicated by the potential interruptions 10 in FIG. 1. The signal lines 13 and 14 pass from the sinusoidal coil 17 and the cosinusoidal coil 18 of the resolver 15 to the second connection 7 and 8 of the control apparatus 1.

Figure 2:
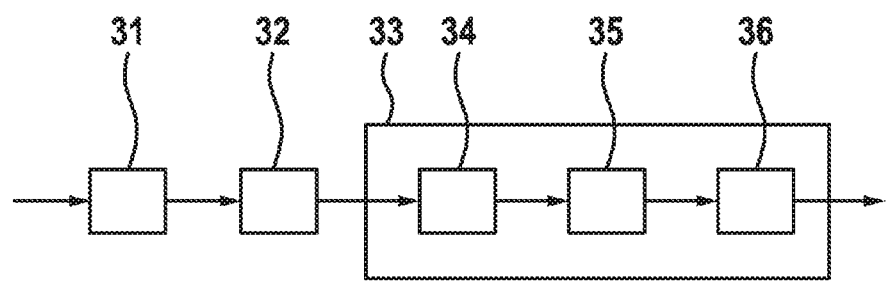
FIG. 2 schematically explains the steps for executing the method according to an exemplary embodiment of the invention.

The method for identifying an open resolver exciter line (10) begins with the step 31 (cf. FIG. 2), in which, at the two connections 7 and 8, the resolver signals are permanently measured and evaluated by the processor 2 to the effect that the amplitude of the measurement signal which is given by the sum of the square of the signal $U_S$ of the sinusoidal coil 17 and of the square of the signal $U_C$ of the cosinusoidal coil 18 is determined. This amplitude of the resolver signal $U_S^2+U_C^2$ is compared with a first threshold value $C_{S1}$ (step 32) and, if this threshold value is undershot, that is to say if the resolver signal is absent, a diagnosis mode (step 33) is started.

In the diagnosis mode 33, the exciter lines 11 and 12 and the exciter coil 16 are examined more closely by an attempt being made to conduct a direct current through them for a short time, for example for an exciter period. A switching apparatus 24 which can comprise, in respect of hardware, two electronic switches 26 and 27 which are controlled by the processor 2 is provided for this purpose. A DC voltage $U_=$ can be applied to the connection 5 by the switch 26. As an alternative to this, power stage 3 could also be driven by the processor 2 such that, instead of the sinusoidal signal, it outputs a temporally constant voltage to ground, as a result of which the switch 26 would be saved.

By virtue of flipping the switch 27, at the same time as the switch 26, the connection 6 is connected to ground via a series resistor 25 $R_{LE}$. In the illustrated case, the series resistor 25 is placed in the ground branch which is connected to the connection 6; however, it could be placed equally efficiently in the branch for DC voltage $U_=$ which is connected to the connection 5.

By virtue of operating the switches 26 and 27, a DC circuit is temporarily closed by the lines 11 and 12 and the exciter coil 16 in any case.

The resistance value $R_{LE}$ of the series resistor 25 is selected to be large in comparison to the non-reactive resistance $R_E$ of the exciter coil 16. In the case of interruption-free exciter lines 11 and 12, that is to say when the fault to be diagnosed is not present, the connections 5 and 6 are connected to one another with a low resistance by means of the exciter coil 16 and are therefore at virtually the same potential since the voltage drop takes place mainly across the series resistor 25. If, however, there is an interruption, the voltage drop is created between the first connections 5 and 6 and can be measured there as a DC voltage difference.

In order that the processor 2 receives this information, the first connections 5 and 6 are connected to an input of a third A/D converter 23, the output of which is supplied to the processor 2. Therefore, the voltage difference $U_E(t_i)$ at the connections 5 and 6 of the exciter line (method step 35 in FIG. 2) is measured at several times $t_i$ during at least one exciter period, specifically during the time for which the DC voltage is applied to the connections 5 and 6 of the exciter lines 11 and 12 by means of the switching arrangement 24.

The processor 2 ascertains from the measurement values of the A/D converter 23 the DC voltage component $U_{E,Offs}$ of the voltage difference $U_E(t_i)$ between the first connections 5 and 6 (method step 36) and establishes that an open exciter line 10 is present when the DC voltage component $U_{E,Offs}$ is greater than a second threshold value $C_{S2}$ during the exciter period. In this case, the DC voltage component can be ascertained in different ways using software. One option is to find, in accordance with the formula $$U_{E,Offs}=\tfrac{1}{2}*(\max(U_E(t_i))+\min(U_E(t_i))),$$

the maximum and minimum of the DC voltage of the measurement values in the measurement interval, and the mean value thereof is the DC voltage component. A further option is to form a mean value of all of the measurement values in the measurement interval in accordance with the formula $$U_{E,Offs}=1/n*\Sigma U_E(t_i).$$

In both cases, the measurement interval should contain at least one exciter period.

On the basis of establishing whether the DC voltage component $U_{E,Offs}$ is greater than the second threshold value $C_{S2}$ or not, and therefore whether an open exciter line 10 is diagnosed or not, the required measures can take place; in particular, the establishment of the fault is displayed or stored, respectively, by a display and/or storage device 9, and the faulty line is indicated, for example, using its color or its reference number. In the case of the exciter line not having an interruption 10, other causes for the absence of the resolver signal at the second connections 7 and 8 can be sought in particular.

The invention claimed is:

1. A method for identifying an open resolver exciter line, the method comprising:
   measuring signal voltages from a sinusoidal coil and a cosinusoidal coil of a resolver;
   comparing the amplitude of a resolver signal, which amplitude is formed by the sum of the squared signal voltages, with a first threshold value;
   starting a diagnosis mode comprising the following steps if the formed amplitude does not reach the first threshold value:
   applying a constant voltage to the connections of the exciter line via a series resistor, which is large in comparison to the non-reactive resistance of an exciter coil, for the duration of at least one exciter period;
   measuring the voltage difference at the connections of the exciter line at a plurality of times while the DC voltage is applied; and
   ascertaining a DC voltage component of the voltage difference;
   establishing an open exciter line when the DC voltage component is greater than a second threshold value during the exciter period.

2. The method as claimed in claim 1, wherein the application operation is performed by switching a connection to a DC voltage potential to one connection of the exciter coil and switching the connection to ground via the series resistor to the other connection of the exciter coil.

3. The method as claimed in claim 1, wherein the application operation is performed by driving one of output stages of an exciter circuit at a constant voltage for one connection of the exciter coil and by switching the connection to ground via the series resistor to the other connection of the exciter coil.

4. The method as claimed in claim 1, wherein the voltage difference at the connections of the exciter lines is measured at several times during the at least one excitation period.

5. The method as claimed in claim 1, wherein the DC voltage component is ascertained depending on a sum of the maximum and minimum measured voltage difference and, when forming the maximum and minimum measured voltage difference, those measurement points are taken into account provided that a DC voltage is applied.

6. The method as claimed in claim 1, wherein the times are equidistant, the DC voltage component is ascertained depending on a mean value of the measured voltage differences while one DC voltage is applied, and wherein the voltage differences are ascertained over the exciter period or a multiple thereof.

7. A circuit for identifying an open resolver exciter line, having:
- a control apparatus with a processor, power stages and first connections for providing signals for the exciter lines to an exciter coil of a resolver and second connections for connecting signal lines for signals of a sinusoidal coil and a cosinusoidal coil;
- two A/D converters which are connected to the second connections of the control apparatus for the signal lines and the outputs of which can be read and evaluated by the processor;
- the resolver exciter lines which are to be diagnosed and couple the first connections to the exciter coil of the resolver; and
- signal lines for the sinusoidal signal and cosinusoidal signal which are provided by the resolver and couple the resolver to the second connections of the control apparatus;
- an electronic switching arrangement, which is controlled by the processor, for temporarily connecting a DC voltage to the first connections for the exciter signal via a series resistor;
- a third A/D converter which is connected to the first connections of the control device and the output of which can be read and evaluated by the processor (2); and
- a display and/or storage device for displaying and/or storing the information which is identified by the processor and which includes the positive identification of an open line of the resolver exciter lines.

8. The circuit as claimed in claim 7, wherein the electronic switching arrangement comprises a switch by means of which a connection for the exciter line can be temporarily connected to ground via the series resistor.

9. The circuit as claimed in claim 7, wherein the electronic switching arrangement comprises a switch by means of which the DC voltage with respect to ground can be temporarily applied to the connection for the exciter line.

* * * * *